United States Patent
Shibasaki et al.

(10) Patent No.: US 9,362,205 B2
(45) Date of Patent: Jun. 7, 2016

(54) CIRCUIT DEVICE

(75) Inventors: Takashi Shibasaki, Gunma (JP); Hidefumi Saito, Isesaki (JP); Takahisa Makino, Kiryu (JP); Masanori Shimizu, Ashikaga (JP); Daisuke Sasaki, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 197 days.

(21) Appl. No.: 13/878,718

(22) PCT Filed: Sep. 15, 2011

(86) PCT No.: PCT/JP2011/005210
§ 371 (c)(1),
(2), (4) Date: May 22, 2013

(87) PCT Pub. No.: WO2012/039115
PCT Pub. Date: Mar. 29, 2012

(65) Prior Publication Data
US 2013/0286617 A1    Oct. 31, 2013

(30) Foreign Application Priority Data
Sep. 24, 2010  (JP) .................................. 2010-213697

(51) Int. Cl.
*H01L 23/482* (2006.01)
*H01L 23/049* (2006.01)
(Continued)

(52) U.S. Cl.
CPC ............ *H01L 23/482* (2013.01); *H01L 23/049* (2013.01); *H01L 23/3735* (2013.01); *H01L 23/49811* (2013.01); *H01L 23/49833* (2013.01);
(Continued)

(58) Field of Classification Search
CPC .............................. H05K 7/20945; H02P 6/00
USPC ................. 361/772; 318/400.3; 257/678, 784
See application file for complete search history.

(56) References Cited

U.S. PATENT DOCUMENTS 4,677,540 A * 6/1987 Fujioka ......................... 363/144
4,831,212 A * 5/1989 Ogata et al. ................... 174/546
(Continued)

FOREIGN PATENT DOCUMENTS

| | | |
|---|---|---|
| JP | 2003-133515 | 5/2003 |
| JP | 2003-133515 A | 5/2003 |

(Continued)

OTHER PUBLICATIONS

Note: Instead of a Machine translation, the contents of WO 2008099952 A1 is understood by the english version US Publication 2010/0117570.*

(Continued)

*Primary Examiner* — Jenny L Wagner
*Assistant Examiner* — Michael P McFadden
(74) *Attorney, Agent, or Firm* — Robert F. Hightower

(57) ABSTRACT

A compact circuit device wherein a semiconductor element that performs high current switching is embedded is provided. A lead (30) and lead (28) though which high current passes are disposed superimposed on the upper surface of a circuit board (12). Also, a plurality of ceramic substrates (22A-22F) are affixed to the circuit board (12), and transistors, diodes, or resistors are mounted to the upper surface of the ceramic substrates. Furthermore, the circuit elements such as the transistors or diodes are connected to the lead (28) or the other lead (30) via fine metal wires.

18 Claims, 9 Drawing Sheets

(51) Int. Cl.
*H01L 23/373* (2006.01)
*H01L 23/498* (2006.01)
*H01L 25/07* (2006.01)
*H02M 7/537* (2006.01)
*H01L 31/02* (2006.01)
*H01L 23/24* (2006.01)
*H01L 23/00* (2006.01)
*H01L 23/29* (2006.01)
*H01L 23/31* (2006.01)

(52) U.S. Cl.
CPC ......... *H01L 23/49844* (2013.01); *H01L 24/48* (2013.01); *H01L 24/49* (2013.01); *H01L 25/072* (2013.01); *H01L 31/02021* (2013.01); *H02M 7/537* (2013.01); *H01L 23/24* (2013.01); *H01L 23/295* (2013.01); *H01L 23/3107* (2013.01); *H01L 24/32* (2013.01); *H01L 24/45* (2013.01); *H01L 24/73* (2013.01); *H01L 24/92* (2013.01); *H01L 2224/32225* (2013.01); *H01L 2224/45014* (2013.01); *H01L 2224/45015* (2013.01); *H01L 2224/45124* (2013.01); *H01L 2224/48091* (2013.01); *H01L 2224/48137* (2013.01); *H01L 2224/48139* (2013.01); *H01L 2224/48227* (2013.01); *H01L 2224/48472* (2013.01); *H01L 2224/48699* (2013.01); *H01L 2224/49111* (2013.01); *H01L 2224/49175* (2013.01); *H01L 2224/73265* (2013.01); *H01L 2224/92247* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01074* (2013.01); *H01L 2924/01082* (2013.01); *H01L 2924/09701* (2013.01); *H01L 2924/1203* (2013.01); *H01L 2924/12041* (2013.01); *H01L 2924/1305* (2013.01); *H01L 2924/13055* (2013.01); *H01L 2924/13091* (2013.01); *H01L 2924/15787* (2013.01); *H01L 2924/181* (2013.01); *H01L 2924/19105* (2013.01); *H01L 2924/19107* (2013.01); *H01L 2924/30107* (2013.01); *Y02E 10/50* (2013.01)

(56) References Cited

U.S. PATENT DOCUMENTS

| | | | | |
|---|---|---|---|---|
| 6,060,772 | A * | 5/2000 | Sugawara | H01L 25/162 257/678 |
| 6,085,415 | A * | 7/2000 | Gandhi et al. | 29/852 |
| 6,272,015 | B1 * | 8/2001 | Mangtani | H05K 7/1432 165/185 |
| 6,885,097 | B2 * | 4/2005 | Maeno | H01L 24/49 257/690 |
| 6,914,321 | B2 * | 7/2005 | Shinohara | H01L 23/4334 257/502 |
| 7,291,928 | B2 * | 11/2007 | Yamada | H01L 24/49 257/762 |
| 2004/0026778 | A1 * | 2/2004 | Grant | 257/706 |
| 2005/0137643 | A1 * | 6/2005 | Mintchev | 607/40 |
| 2008/0191340 | A1 * | 8/2008 | Stolze et al. | 257/719 |
| 2010/0117570 | A1 * | 5/2010 | Nishimori et al. | 318/400.3 |

FOREIGN PATENT DOCUMENTS

| | | |
|---|---|---|
| JP | 2004-319740 | 11/2004 |
| JP | 2007-36014 | 2/2007 |
| WO | WO 2008099952 A1 * | 8/2008 |

OTHER PUBLICATIONS

International Search Report mailed Dec. 13, 2011, directed to International Application No. PCT/JP2011/005210; 3 pages.

The Notice of Reasons for Rejection mailed Feb. 24, 2015, received in the corresponding Japanese Patent Application No. 2012-534924, 3 pages.

\* cited by examiner

CIRCUIT DEVICE

REFERENCE TO RELATED APPLICATIONS

This application is a national stage application under 35 USC 371 of International Application No. PCT/JP2011/005210, filed Sep. 15, 2011, which claims the priority of Japanese Patent Application No. 2010-213697, filed Sep. 24, 2010, the entire contents of which are incorporated herein by reference.

FIELD OF THE INVENTION

A preferred embodiment of the invention relates to a circuit device, and specifically, relates to a circuit device in which a power semiconductor element for switching a high current is mounted on the upper surface of a circuit board.

BACKGROUND OF THE INVENTION

With reference to FIG. 9, the configuration of a conventional configuration integrated circuit device 100 will be explained. Firstly, a predetermined electric circuit is formed such that a conductive pattern 103 is formed on the surface of a rectangular substrate 101 with an insulating layer 102 of a thickness of about 200 μm interposed therebetween, and circuit elements are connected to desired portions of the conductive pattern 103. Here, as the circuit elements, a semiconductor element 105A and a chip element 105B are fixed thereto. Further, an electrode formed on an upper surface of the semiconductor element 105A is connected to the desired conductive pattern 103 through a fine metal wire 114, and electrodes provided on both ends of the chip element 105B are fixed to the conductive pattern via solder. Moreover, a lead 104 is connected to a pad made of a conductive pattern 109 formed in a periphery part of the substrate 101, and functions as an external terminal. A sealing resin 108 has a function of sealing the electric circuit formed on the surface of the substrate 101.

A case material 111 has a frame-like shape, and abuts on the side surfaces of the substrate 101, whereby a space for filling the sealing resin 108 is formed on the upper surface of the substrate 101.

A manufacturing method of the hybrid integrated circuit device 100 of the configuration mentioned above is as follows. Firstly, the conductive pattern 103 having a predetermined shape is formed on the upper surface of the substrate 101, the upper surface coated with the insulating layer 102 made of a resin. Next, a circuit element such as the semiconductor element 105A is placed on the upper surface of the substrate 101, and the predetermined conductive pattern 103 and the semiconductor element 105A are electrically connected to each other. In addition, the lead 104 is fixed to the conductive pattern 109 formed in a pad shape. Next, the case material 111 is attached, and the liquid or semisolid sealing resin 108 is injected into a space surrounded by the case material 111 and then is cured by heating, thereby sealing the semiconductor element 105A and the fine metal wire 114 with the resin.

Patent Document 1: Japanese Patent Application Publication No. 2007-036014.

SUMMARY

However, in the case of the hybrid integrated circuit device 100 of the configuration mentioned above, the lead 104 and the semiconductor element 105A are connected to each other through the conductive pattern 103 formed on the upper surface of the substrate 101 and having a thickness of about 100 μm. Accordingly, when the semiconductor element 105A is configured to switch a high current of about several tens of amperes, the width of the conductive pattern 103 needs to be widened in order to secure the large current capacity. This has prevented downsizing of the hybrid integrated circuit device 100.

The preferred embodiment of the invention was made in view of the problem described above, and a main objective of the preferred embodiment of the invention is to provide a compact circuit device including a built-in semiconductor element for high current switching A circuit device in the preferred embodiment of the invention includes: a circuit board; a semiconductor element disposed on an upper surface of the circuit board; a first lead electrically connected to the semiconductor element, on the upper surface of the circuit board; and a second lead electrically connected to the semiconductor element, at least a part of the second lead being superimposed on the first lead.

With the preferred embodiment of the invention, the first lead and the second lead connected to the embedded semiconductor elements are disposed to be superimposed on each other in a state being insulated from the circuit board. Accordingly, the first lead and the second lead occupy a reduced area on the upper surface of the circuit board to contribute to downsizing of the entire device.

Moreover, the semiconductor element mounted on the upper surface of the circuit board is not connected to a conductive pattern on the circuit board but is directly connected to the lead disposed on the upper surface of the circuit board. Accordingly, no conductive pattern needs to be formed on the upper surface of the circuit board, which eliminates a problem of a short circuit between the circuit board and the conductive pattern.

BRIEF DESCRIPTION OF THE DRAWINGS

FIG. 1 depicts views of a circuit device according to a preferred embodiment of the invention.

FIG. 6 depicts views illustrating a manufacturing method of the circuit device in the preferred embodiment of the invention.

FIG. 7 depicts views illustrating the manufacturing method of the circuit device in the preferred embodiment of the invention.

FIG. 8 depicts views illustrating the manufacturing method of the circuit device in the preferred embodiment of the invention.

DETAILED DESCRIPTION OF THE DRAWINGS

Figure 1A:
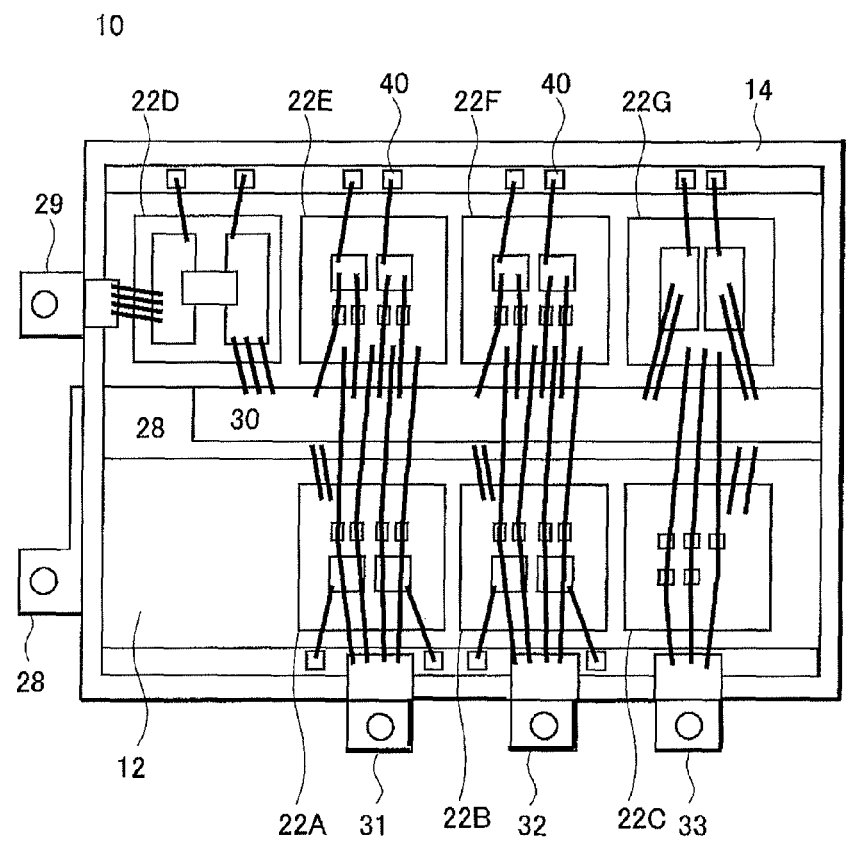
FIG. 1A is a plan view thereof.

With reference to FIG. 1 to FIG. 4, the structure of a hybrid integrated circuit device 10 will be explained as an example of a circuit device.

With reference to FIG. 1, the hybrid integrated circuit device 10 is mainly provided with a circuit board 12, two leads 28 and 30 which are superimposed on an upper surface of the circuit board 12, circuit elements such as a transistor 34 which are disposed on the upper surface of the circuit board 12 and close to the leads 28 and 30, a frame-shaped case material 14 fixed to the upper surface of the circuit board 12, and a sealing resin 16 filled in a region surrounded by the case material 14.

Figure 2:
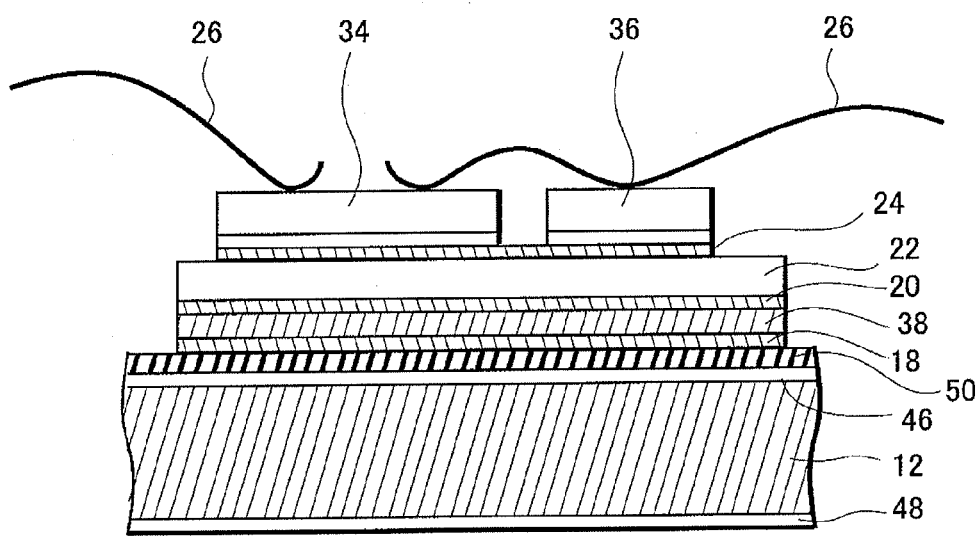
FIG. 2 is a cross-sectional view illustrating an enlarged portion where a ceramic substrate is mounted in the circuit device in the preferred embodiment of the invention.

The circuit board 12 is a circuit board containing aluminum (Al), copper (Cu), or the like as a main material. When a substrate made of aluminum is employed as the circuit board 12, both main surfaces of the circuit board 12 are coated with anodized films. In order to improve the heat radiation property, the circuit board 12 has a thickness of, for example, about 0.5 mm or more and 2.0 mm or less. Note that, as for a material of the circuit board 12, a material other than a metal can be employed, and for example, a resin material such as a glass epoxy substrate, ceramic, or the like, can be employed. Here, as illustrated in FIG. 2, the upper surface of the circuit board 12 made of a metal is coated with an insulating layer 50 made of a resin material and having a thickness of about 60 μm, and an island 18 is formed on an upper surface of the insulating layer 50.

The lead 28 is incorporated in the case material 14, and is disposed on the upper surface of the circuit board 12 in such a manner as to traverse a central portion of the circuit board 12 while one end thereof leads to the outside on the left side of the drawing. The lead 28 is connected to a positive electrode side of a direct-current power supply, and direct-current power yet to be converted by an inverter circuit passes through the lead 28. Moreover, the lead 28 has a width of, for example, about 7 mm, and is formed to be wider than the width (5.0 mm) of the lead 30 disposed in a manner superimposed above the lead 28. Thus, a portion of the upper surface of the output lead 28 disposed below is exposed, and a fine metal wire can be connected to the exposed portion of the upper surface.

The lead 30 is incorporated in the case material 14 in a manner superimposed above the lead 28. Here, the lead 30 is not exposed to the outside, but is connected to a lead 29 leading to the outside, through a conductive pattern formed on an upper surface of a ceramic substrate 22D. The lead 30 is connected to a negative electrode side of the direct-current power supply through the lead 29 exposed to the outside, and has a function of routing the direct-current power inside the device. Here, the thickness of each of the leads 28 and 30 is, for example, 1 mm or more.

Figure 1B:
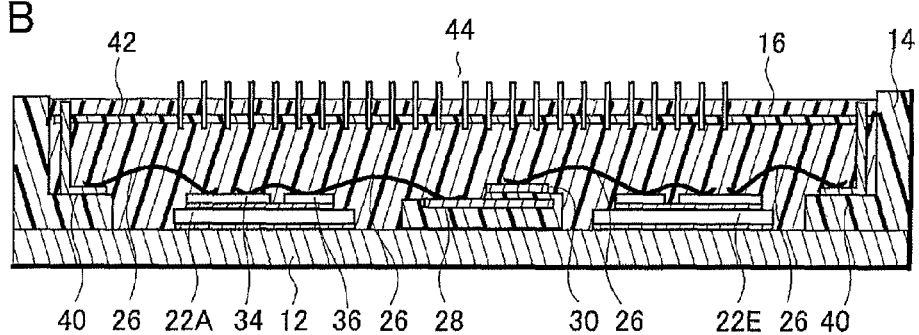
FIG. 1B is a cross-sectional view thereof.

Moreover, with reference to FIG. 1B, the lead 28 and the lead 30 are insulated from each other with the insulating material of the case material 14 interposed therebetween. Specifically, the lead 28 and the lead 30 are away from each other in the thickness direction by a distance of, for example, 1 mm or more. In addition, a lower surface of the lead 28 and the upper surface of the circuit board 12 are also insulated from each other by the insulating material of the case material 14, and the insulating material in this case has a thickness of, for example, 1 mm or more.

Meanwhile, leads 31, 32, and 33 provided at a lower side of the case material 14 of the drawing illustrated in FIG. 1A are for outputting alternating-current power converted by a built-in inverter circuit. Portions of these leads exposed to the inside are connected to semiconductor elements through fine metal wires. Here, a portion of each of the leads exposed to the outside may be provided with a through-hole for a screw or may be on-board by being solder-connected to a PCB of the set side.

The case material 14 is formed in a frame shape by injection molding of a resin material such as an epoxy resin, and all the leads mentioned above are incorporated therein. Moreover, the case material 14 is fixed to the upper surface of the periphery part of the circuit board 12 to form a space for resin-sealing of the circuit elements such as the transistor 34 on the upper surface of the circuit board 12. In addition, wiring leads 40 to be connected to control electrodes of the embedded semiconductor elements are disposed at the upper and lower sides of the case material 14 of the drawing.

Ceramic substrates 22A-22G are made of an inorganic solid material such as $Al_2O_3$ (alumina), AlN (aluminum nitride), or the like, and have a thickness of, for example, 0.25 mm or more and 1.0 mm or less. The ceramic substrate 22 has a function of insulating the transistor 34 mounted on the upper surface thereof from the circuit board 12. The structure of fixing the ceramic substrate 22 to the circuit board 12 will be described later with reference to FIG. 2. Moreover, the heat generated by the transistor 34 or a diode 36 during operation is dissipated to the outside through the ceramic substrate 22 and the circuit board 12.

With reference to FIG. 1B, portions of the wiring leads 40 around the upper ends are fixed by being inserted into through-holes of a substrate 42. In other words, the circuit elements such as the transistor 34 which are disposed on the upper surface of the circuit board 12 are electrically connected to the substrate 42 through the wiring leads 40. Multiple signal leads 44 are disposed on the substrate 42, and the signal leads 44 function as external connection terminals. The substrate 42 is formed of, for example, a glass epoxy substrate having a thickness of about 1 mm and having conductive patterns formed on the main surface thereof. The substrate 42 may be a ceramic substrate or a metal substrate.

The sealing resin 16 is made of a resin material, such as an epoxy, into which a filler such as alumina is filled, and is filled into the space surrounded by the case material 14 on the upper surface of the circuit board 12. Further, the sealing resin 16 seals the ceramic substrate 22A and so on, the transistor 34, the diode 36, fine metal wires 26, the substrate 42, and the like.

With reference to FIG. 1A, multiple ceramic substrates are disposed on the upper surface of the circuit board 12. Specifically, seven ceramic substrates 22A-22G are fixed to the upper surface of the circuit board 12, and each predetermined circuit element is mounted on the upper surface of each of the ceramic substrates 22A-22G.

Transistors including an IGBT, an MOSFET, and the like and diodes are mounted on the upper surfaces of the ceramic substrates 22A, 22B, 22E, and 22F, and these elements constitute an inverter circuit. Further, diodes are mounted on the ceramic substrate 22C and transistors including an IGBT, an MOSFET, and the like are mounted on the ceramic substrate 22G, and these elements constitute a converter circuit. Moreover, resistances for detecting a current value are disposed on the upper surface of the ceramic substrate 22D.

In the embodiment, the lead 28 and the lead 30 which are wide leads through which a direct-current of, for example, about 70 amperes passes are disposed in the superimposed manner on the upper surface of the circuit board 12. Thus, the leads 28 and 30 occupy a reduced area in comparison with a case where both of the leads are disposed on the same plane, thereby downsizing the entire device.

Further in the embodiment, the leads 28 and 30 are disposed in the superimposed manner in a region by which the circuit board 12 is evenly divided around the central portion thereof. Further, the circuit elements such as transistors are disposed around the region where these leads are disposed in the superimposed manner, and are connected to the leads through the fine metal wires. Thus, the circuit elements such as transistors are disposed close to the leads 28 and 30. This shortens the fine metal wires connecting the leads and the circuit elements, and thereby makes it possible to reduce the electric resistance of the connection means.

Further in the embodiment, an effect of pair wiring can be obtained in such a way that the lead 30 connected to the negative electrode side of the direct-current power supply is superimposed on the lead 28 connected to the positive electrode side of the direct-current power supply. Specifically, a magnetic field generated when the current passes through the lead 30 and a magnetic field generated when the current passes through the lead 28 are canceled with each other to reduce a noise generated.

Further in the embodiment, two transistors included in the inverter circuit and connected in series are disposed across the leads 28 and 30.

Further in the embodiment, the circuit elements such as transistors are connected to one another on the upper surface of the circuit board 12 through the leads 28, 30, and 31A-31C each having a large cross-sectional area to improve the electric characteristics. Specifically, wiring inductance is reduced to suppress switching voltage vibration generated at switching operation with an L load and a generation amount of noise.

With reference to FIG. 2, the structure of fixing the ceramic substrate 22 to the circuit board 12 will be explained. Firstly, when the circuit board 12 is a circuit board made of aluminum, the upper surface and the lower surface of the circuit board 12 are respectively coated with oxide films 46 and 48 formed of anodized aluminum by anodic oxidation. Further, the upper surface of the circuit board 12 on which the oxide film 46 is formed is coated with the insulating layer 50 made of a resin material into which a filler is highly filled.

On the upper surface of the circuit board 12, the island 18 having a thickness of about 50 μm is formed by etching a metal film such as copper in a predetermined shape. The island 18 is not used as wiring for an electric signal to pass. In the embodiment, the island 18 is used for improving the wettability of a fixing material 38 used to fix the ceramic substrate 22.

The lower surface of the ceramic substrate 22 is coated with a metal film 20 having a thickness of about 250 μm. Here, the metal film 20 is formed to entirely cover all over the lower surface region of the ceramic substrate 22. Thus, when solder is used as the fixing material 38, the solder is excellently welded to the entire lower surface region of the ceramic substrate 22. Moreover, the solder is excellently welded also to the island 18 provided on the upper surface of the circuit board 12. Accordingly, the ceramic substrate 22 is firmly fixed to the circuit board 12 with the fixing material 38. In addition, the solder which is a metal excellent in thermal conductivity is employed as the fixing material 38 to allow the heat generated when the transistor 34 is being operated to be excellently conducted to the circuit board 12.

On the upper surface of the ceramic substrate 22, a conductive pattern 24 in which a metal film having a thickness of about 250 μm is etched in a predetermined shape is formed. Further, the transistor 34 or the diode 36 is mounted on the conductive pattern 24 with the conductive fixing material such as the solder. The conductive pattern 24 is configured to include islands on which the circuit elements such as the transistor 34 are mounted, a wiring section for connecting the elements to each other, and a pad for bonding a fine metal wire, and the like.

As for the transistor 34, an MOSFET, an IGBT, or a bipolar transistor is employed. In the embodiment, the transistor 34 performs switching of a high current, for example, having a current value of one ampere or more. An electrode provided on the lower surface of the transistor 34 is connected to the conductive pattern 24 with the conductive fixing material such as the solder. In the following explanation, a case where an IGBT is employed as the transistor will be explained.

The diode 36 has an electrode provided on the upper surface thereof and connected to the transistor 34 with the fine metal wire 26, and an electrode provided on the lower surface thereof and connected to the conductive pattern 24 with the conductive fixing agent such as the solder.

As for a specific example, when the transistor 34 is an IGBT, an emitter electrode provided on the upper surface of the transistor 34 is connected to an anode electrode provided on the upper surface of the diode through the fine metal wire 26. Further, a collector electrode provided on the lower surface of the transistor 34 is connected to a cathode electrode provided on the lower surface of the diode through the conductive pattern 24. The details of the connection structure will be described later with reference to FIG. 3 and FIG. 4.

Here, the fine metal wires 26 mentioned above and used for the electric connection between the transistors and the like are made of, for example, aluminum having a diameter of about 150 μm to 500 μm. Moreover, instead of the fine metal wires 26, ribbon bonding in which a metal foil such as aluminum is formed in a ribbon state may be employed.

In the embodiment, similar to the technology in the background art, the insulating layer 50 made of a resin is provided on the upper surface of the circuit board 12. The insulating layer 50 has a thickness of, for example, 60 μm (50 μm or more and 70 μm or less). The material of the insulating layer 50 is similar to that in the background art, and obtained such that a filler such as alumina is highly filled into a resin material such as an epoxy resin.

The upper surface of the circuit board 12 is coated with the insulating layer 50 in order to easily form the island 18. In other words, it is possible to form the island 18 made of copper directly on the upper surface of the oxide film 46 which coats the upper surface of the circuit board 12, however, this results in a weaker adhesion strength between the circuit board 12 and the island 18. Therefore, in the embodiment, the insulating layer 50 made of an organic material is interposed between the circuit board 12 and the island 18 to improve the adhesion strength between the island 18 and the circuit board 12.

The breakdown voltage of the insulating layer 50 formed to be thin is lower than that in the background art. However, because the island 18 formed on the upper surface of the insulating layer 50 is not connected to the transistor 34, the high breakdown voltage is not necessary for the insulating layer 50 in the embodiment.

In addition, the thermal conductivity of the thin insulating layer 50 in the embodiment is 4 W/mK or more, which is four or more times the thermal conductivity of the thick insulating layer 102 having a thickness of about 200 μm. Accordingly, it is possible to excellently release the heat generated in the transistor 34 to the outside through the insulating layer 50.

Here, in the explanation mentioned above, the transistor 34 and the diode 36 are fixed to the upper surface of the insulating ceramic substrate 22, however, it is possible to fix the transistor 34 and the like directly to the conductive pattern formed on the upper surface of the circuit board 12.

Figure 3:
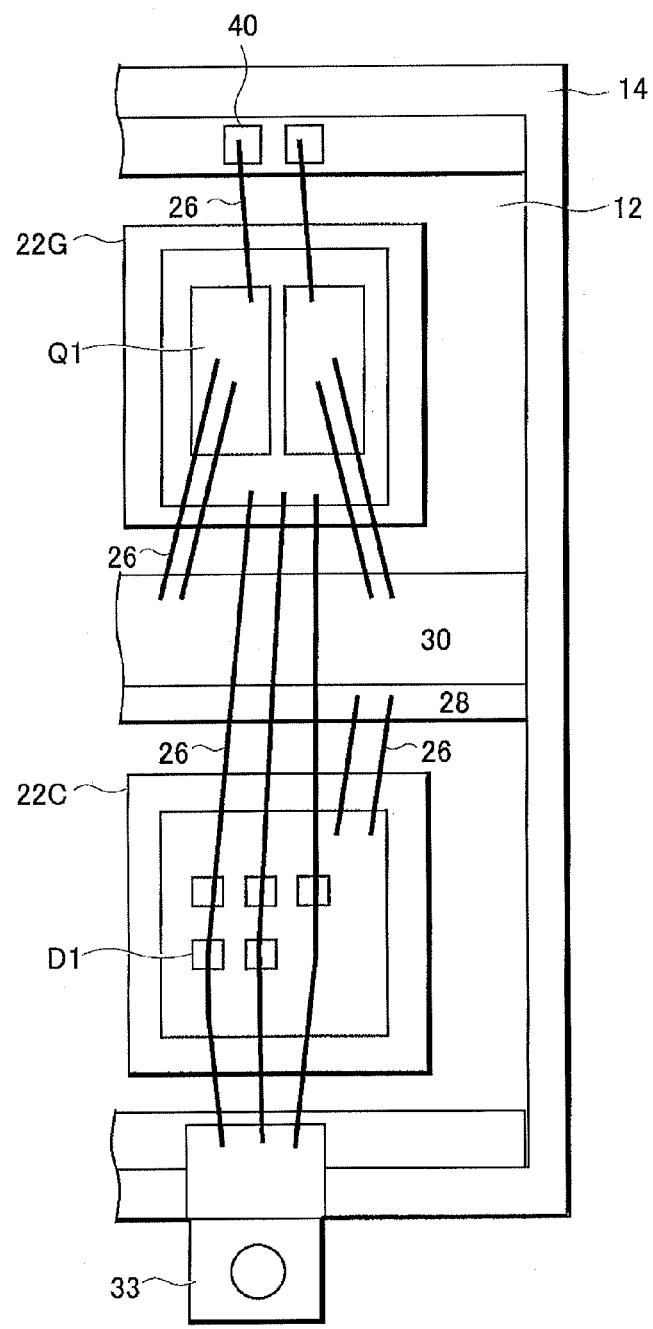
FIG. 3 is a plan view illustrating an enlarged portion where circuit elements constituting a converter circuit are mounted in the circuit device in the preferred embodiment of the invention.

In FIG. 3, the structure of connecting IGBTs(Q1s) and diodes D1s constituting the converter circuit inside the hybrid integrated circuit device is explained. Here, two IGBTs(Q1s) are mounted on the upper surface of the ceramic substrate 22G, and five diodes are mounted on the upper surface of the ceramic substrate 22C. Here, the IGBTs(Q1s) and the diodes D1s are disposed to be opposed to each other across the lead 28 and the lead 30.

The collector electrode provided on the rear surface of the IGBT(Q1) is connected to the conductive pattern of the ceramic substrate 22G with the conductive fixing material such as the solder, the emitter electrode on the upper surface thereof is connected to the lead 30 with the fine metal wire 26, and a gate electrode on the upper surface thereof is connected to the wiring lead 40 with the fine metal wire 26. Accordingly, the surface emitter electrode of the IGBT(Q1) is connected to the negative electrode side of the direct-current power supply through the lead 30. Here, the electrodes of the two IGBTs (Q1s) are connected in parallel, which allows the large current capacity to be secured.

On the upper surface of the ceramic substrate 22C, cathode electrodes of the five diodes D1s are connected with solder. Further, anode electrodes on the upper surfaces of the diodes D1s are connected to the conductive pattern of the ceramic substrate 22G (in other words, the collector electrodes provided on the rear surfaces of the IGBTs(Q1s)) and the lead 33, through the fine metal wires 26. In addition, the conductive pattern of the ceramic substrate 22C is connected to the lead 28 through the fine metal wire. Accordingly, the cathode electrodes of the diodes D1s are connected to the positive electrode side of the direct-current power supply. Here, the configuration and the like of the converter circuit including the IGBTs(Q1s) and the like will be described later with reference to FIG. 5A.

Figure 4:
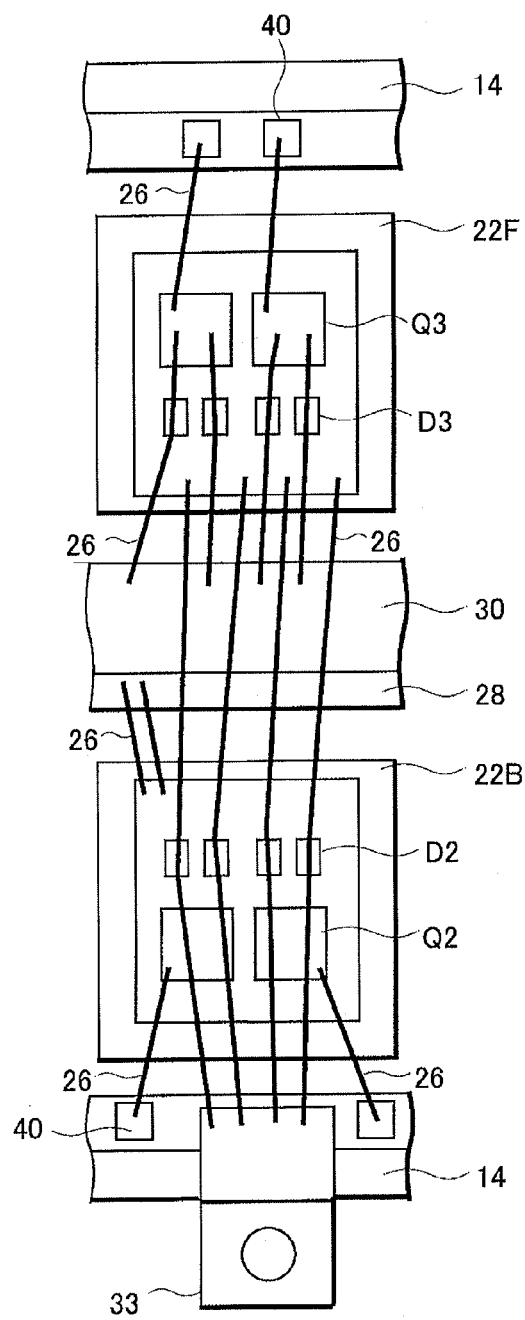
FIG. 4 is a plan view illustrating an enlarged portion where circuit elements constituting an inverter circuit are mounted in the circuit device in the preferred embodiment of the invention.

With reference to FIG. 4, the structure of connecting elements constituting the inverter circuit will be explained. Here, the lead 28 and the lead 30 are disposed, in the superimposed manner, on a region around the central portion of the circuit board 12 in the transverse direction of the drawing. The lead 28 receives a direct-current voltage boosted by the converter circuit. Here, IGBTs(Q3s) and IGBTs(Q2s) are connected in series between the direct-current power supplies and complementarily perform switching to generate alternating-current power having a predetermined frequency, which will be explained later with reference to a circuit diagram.

In the upper side of the leads 28 and 30 of the drawing, the IGBTs(Q3s) and diodes D3s are connected to the ceramic substrate 22F. Electrodes on the rear surfaces thereof are fixed to the same conductive pattern provided on the upper surface of the ceramic substrate 22F with solder. Accordingly, the collector electrode provided on the rear surface of the IGBT (Q3) and the cathode electrode provided on the rear surface of the diode D3 are connected to each other through the conductive pattern of the ceramic substrate 22F. Moreover, the gate electrode provided on the upper surface of the IGBT(Q3) is connected to the wiring lead 40 provided on the side wall of the case material 14 through the fine metal wire 26. In addition, the emitter electrode of the IGBT(Q3) and the anode electrode of the diode D3 are connected to the lead 30 through the multiple fine metal wires 26.

Note that, the two IGBTs(Q3s) are mounted on the upper surface of the ceramic substrate 22F, and the respective electrodes of both the elements are connected in common. In other words, the two IGBTs(Q3s) are connected in parallel, which allows the large current capacity to be secured. This also applies to other ceramic substrates.

Moreover, the conductive pattern of the ceramic substrate 22F is connected to anode electrodes of diodes D2 mounted on the ceramic base 22B and emitter electrodes of the IGBTs (Q2s) through the fine metal wires 26, and is further connected to the lead 32. The fine metal wires 26 connecting these electrodes are formed across over the leads 28 and 30.

Collector electrodes provided on the rear surfaces of the IGBTs(Q2s) and cathode electrodes provided on the rear surfaces of the diodes D2s are mounted on the conductive pattern provided on the upper surface of the ceramic substrate 22B with the conductive fixing material such as the solder. Further, the conductive pattern on which these elements are mounted is connected to the lead 28 through the fine metal wire 26. In addition, gate electrodes of the IGBTs(Q2s) are connected to the wiring leads 40 respectively via the fine metal wires 26.

The IGBT(Q2) and the IGBT(Q3) connected to each other as mentioned above convert the direct-current power into the alternating-current power. Specifically, the direct-current power supplied from the lead 28 and the lead 30 is supplied to the IGBT(Q2) and the IGBT(Q3). Further, these IGBTs complementarily perform switching on the basis of a control signal to generate alternating-current power, and the alternating-current power is outputted to the outside through the lead 33.

Here, with reference to FIG. 1A, circuit elements mounted on the upper surfaces of the ceramic substrates 22F and 22B and the connection structure thereof are similar to those mentioned above. In other words, diodes and transistors are mounted on the upper surfaces of the ceramic substrates 22F and 22B. Further, the transistor mounted on the ceramic substrate 22F and the transistor mounted on the ceramic substrate 22B are connected to each other in series through the fine metal wire 26. As a result of this structure, the direct-current power supplied from the lead 30 and the lead 28 is converted by the transistors mounted on the ceramic substrates 22F and 22B into alternating-current power, and the alternating-current power is outputted to the outside through the lead 32.

Figure 5A:
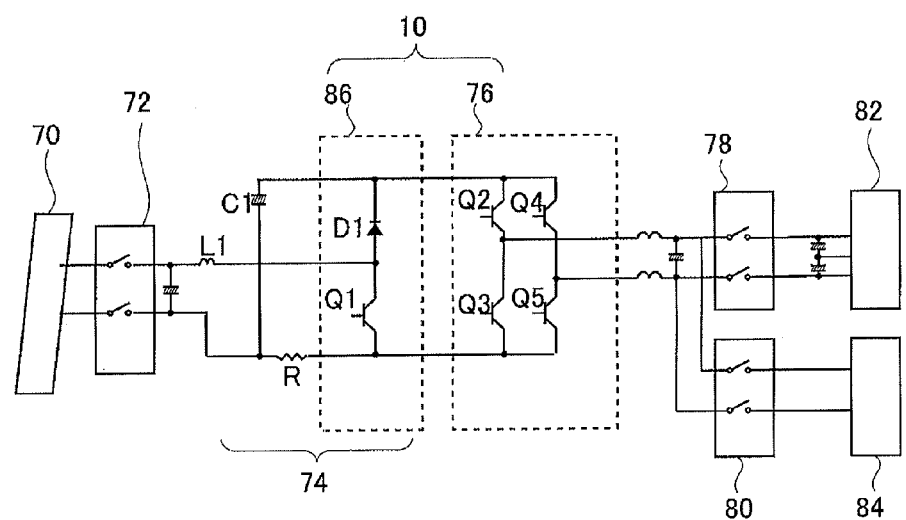
FIG. 5A is a circuit diagram illustrating a solar power generation system in which the circuit device in the preferred embodiment of the invention is incorporated.
Figure 5B:
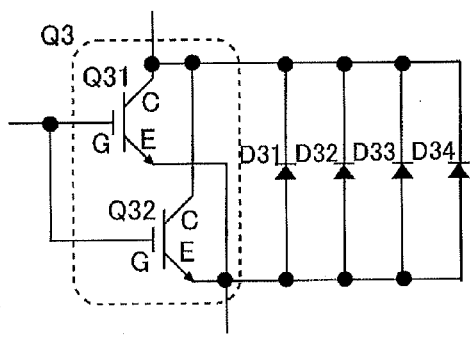
FIG. 5B is a partially enlarged circuit diagram.

Next, with reference to FIG. 5, the circuit configuration of a solar cell generation system in which the hybrid integrated circuit device 10 mentioned above is incorporated will be explained. FIG. 5A is a circuit diagram illustrating an overall solar cell generation system, and FIG. 5B is a circuit diagram illustrating the IGBT(Q3) included in the system in detail.

The generation system illustrated in the drawing is provided with a solar cell 70, a solar cell opening and closing unit 72, a boost chopper 74, an inverter 76, and relays 78 and 80. The electric power generated by the generation device of such a configuration is supplied to an electric power system 82 or a load 84 for self-sustaining operation. Moreover, a converter 86 and the inverter 76 which are parts of the boost chopper 74 are incorporated in the hybrid integrated circuit device 10 of the embodiment.

The solar cell 70 is a converter to convert radiated light into electric power to be outputted, and outputs the direct-current electric power. Although one solar cell 70 is illustrated here, multiple solar cells 70 in a state being connected in series and in parallel may be employed.

The solar cell opening and closing unit 72 is provided with a function of collecting the electricity generated in the solar cell 70 and preventing backflow thereof, and supplying a direct-current current to the boost chopper 74.

The boost chopper 74 is provided with a function of boosting a voltage of the direct-current power supplied from the solar cell 70. In the boost chopper 74, the IGBT(Q1) repeats an ON operation and an OFF operation periodically to boost the direct-current power at the voltage of about 250 V generated by the solar cell 70 to the direct-current power of about 300 V. Specifically, the boost chopper 74 is provided with a coil L1 connected in series to an output terminal of the solar cell, and the IGBT(Q1) connected between the coil L1 and a ground terminal. Further, the direct-current power boosted by the coil L1 is supplied to the inverter 76 of the next stage via the diode D1 and a smoothing capacitor C1 for a backflow device.

In the embodiment, the IGBTs(Q1s) and the diodes D1s included in the boost chopper 74 are placed on the upper surfaces of the ceramic substrates 22G and 22C illustrated in FIG. 1A. Moreover, the switching of the IGBT(Q1) is performed on the basis of control signals externally supplied through the signal leads 44 and the wiring leads 40, illustrated in FIG. 1B.

The direct-current power boosted by the boost chopper 74 is converted into alternating-current power having a predetermined frequency by the inverter 76. The inverter 76 is provided with the two IGBTs (Q2) and Q3 connected in series between the output terminal of the boost chopper 74, and two IGBTs (Q4) and Q5 connected in series as well. Moreover, the switching of these transistors are controlled by a control signal supplied from the outside, the transistors Q2 and Q3 and the transistors Q4 and Q5 are complementarily switched. Further, the alternating-current power set to the predetermined frequency by these switching is outputted to the outside from a connection point between the transistors Q2 and Q3 and a connection point between the transistors Q4 and Q5. Here, the two-phase inverter circuit consisting of four transistors is constructed. Note that, referring to FIG. 1A, the transistors Q2, Q3, Q4 and Q5 are mounted on the ceramic substrates 22B, 22F, 22A, and 22E.

The alternating-current power converted by the inverter 76 is supplied to the commercial electric power system 82 or the load 84 for self-sustaining operation. The relay 78 is interposed between the electric power system 82 and the inverter 76, the relay 78 is in a conduction state at the normal time, and the relay 78 is in a cut-off state if abnormality is detected either one of electric power system 82 and the inverter 76. Moreover, the relay 80 is interposed also between the inverter 76 and the load for self-sustaining operation, and the supply of electric power is cut off by the relay 80 in an abnormal state.

Further in the embodiment, the elements included in the boost chopper 74 and the inverter 76 are fixed to the upper surfaces of the ceramic substrates 22 illustrated in FIG. 2. Accordingly, even if the inverter circuit is operated, because no voltage is applied to the upper surface of the island 18 formed on the upper surface of the circuit board 12, no short circuit is generated between the circuit board 12 and the island 18.

With reference to FIG. 5B, the IGBT(Q3) which is one of the transistors included in the inverter 76 mentioned above is configured to include two IGBTs (Q31) and (Q32), and four diodes D31, D32, D33, and D34 which are inversely connected to main electrodes of these transistors.

The IGBT(Q31) and the IGBT(Q32) are connected to each other in parallel. Specifically, gate electrodes, emitter electrodes, and collector electrodes of the IGBT(Q31) and the IGBT(Q32) are connected in common. Thus, the larger current capacity can be obtained than in the case of one transistor.

Moreover, anode electrodes of the diodes D31, D32, D33, and D34 are connected to the emitter electrodes of the IGBT (Q31) and the IGBT(Q31). Further, cathode electrodes of these diodes are connected to the collector electrodes of the IGBT(Q31) and the IGBT(Q32).

Next, with reference to FIG. 6 to FIG. 8, a manufacturing method of the hybrid integrated circuit device 10 mentioned above will be explained.

Figure 6A:
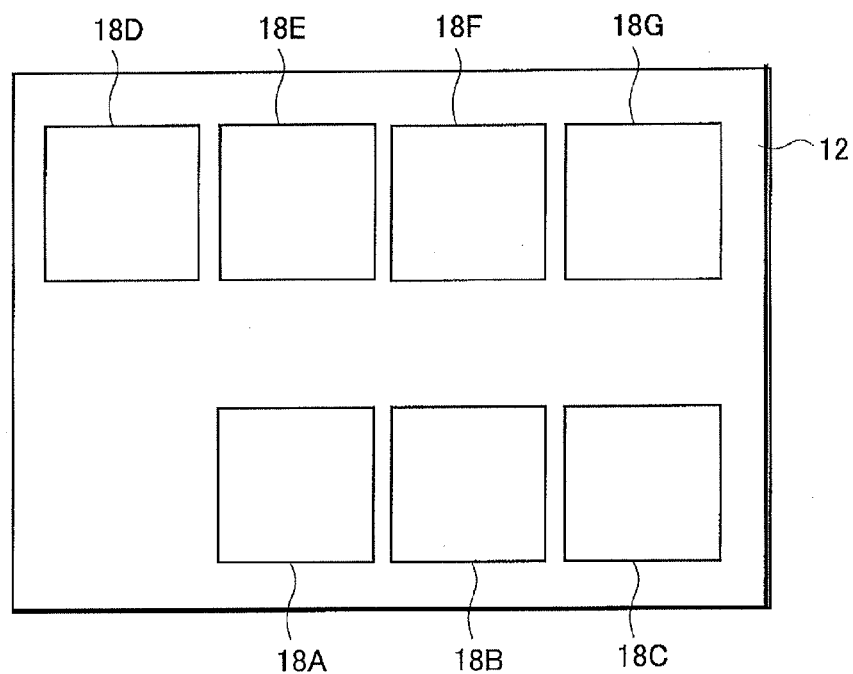
FIG. 6A is a plan view.
Figure 6B:
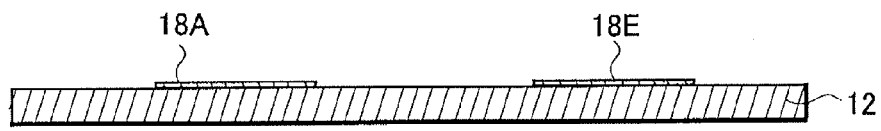
FIG. 6B is a cross-sectional view.
Figure 6C:
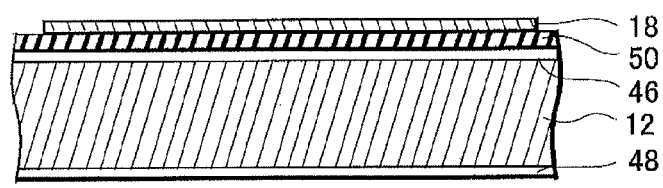
FIG. 6C is an enlarged cross-sectional view.

Firstly, with reference to FIG. 6, the circuit board 12 is prepared. FIG. 6A is a plan view illustrating this process, and FIG. 6B and FIG. 6C are cross-sectional views illustrating this process.

With reference to FIG. 6A and FIG. 6B, the circuit board 12 to be prepared is a circuit board made of a thick metal, such as aluminum and copper, having a thickness of about 1 mm to 3 mm. When aluminum is employed as a material of the circuit board 12, the upper surface and the lower surface of the circuit board 12 are coated with anodized films. Note that, the circuit board 12 is molded in a predetermined shape by performing press processing or grinding processing with respect to a large-sized circuit board.

Islands 18A-18G are formed by etching the copper foil stuck on the upper surface of the circuit board 12 in a predetermined shape. The islands 18A-18G are not for circuit elements such as transistors being mounted thereon but for improving the wettability of solder used when ceramic substrate is mounted, which is described later.

With reference to FIG. 6C, when aluminum is employed as a material of the circuit board 12, the upper surface and the lower surface of the circuit board 12 are respectively coated with the oxide films 46 and 48 formed of anodized aluminum by anodic oxidation. In addition, the upper surface of the oxide film 46 on which the oxide film 46 is formed is coated with the insulating layer 50. The composition or the thickness of the insulating layer 50 is as mentioned above. When the insulating layer 50 is provided, the island 18 can firmly adhere to the circuit board 12 because the insulating layer 50 containing a resin of an organic material has good adhesiveness with the island 18.

Figure 7A:
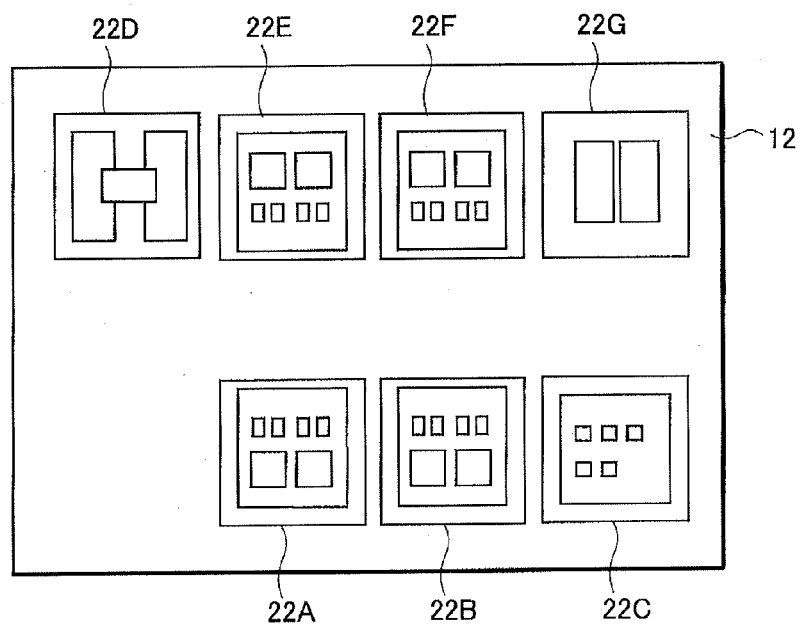
FIG. 7A is a plan view.
Figure 7B:
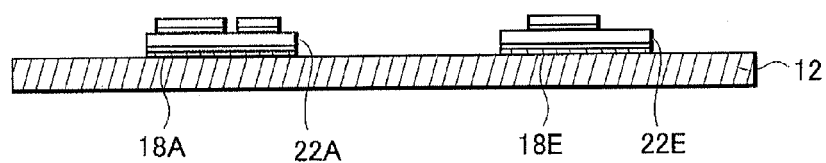
FIG. 7B is a cross-sectional view.
Figure 7C:
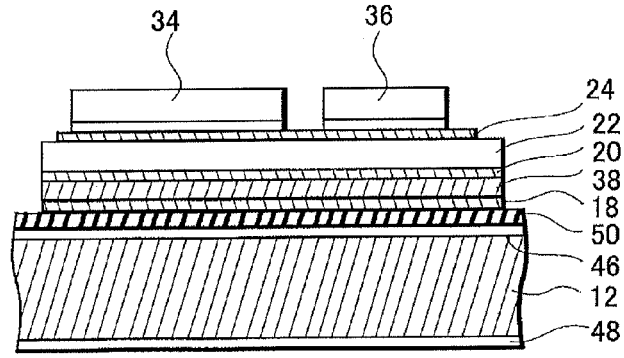
FIG. 7C is an enlarged cross-sectional view.

Next, with reference to FIG. 7, ceramic substrates are disposed on predetermined portions of the circuit board 12. FIG. 7A is a plan view illustrating this process, and FIG. 7B and FIG. 7C are cross-sectional views.

With reference to FIG. 7A, the ceramic substrates 22A-22G on which predetermined circuit elements such as transistors and diodes are mounted on are fixed to the upper surface of the circuit board 12. Here, the ceramic substrates 22A-22G are respectively fixed to the upper surfaces of the islands 18A-18G formed on the upper surface of the circuit board 12 in the previous process.

With reference to FIG. 7C, the conductive pattern 24 and the metal film 20 are respectively formed on the upper surface and the lower surface of the ceramic substrate 22. Further, the metal film 20 with which the lower surface of the ceramic substrate 22 is coated is fixed to the island 18 provided on the upper surface of the circuit board 12 with the fixing material 38 such as solder. The metal film 20 is provided to entirely cover all over the lower surface of the ceramic substrate 22, and thereby the fixing material 38 is adhered on the entire lower surface region of the ceramic substrate 22. Accordingly, the ceramic substrate 22 is firmly joined to the circuit board 12. Here, the transistor 34 and the diode 36 may be fixed on the upper surface of the ceramic substrate 22 in advance, or alternatively, these elements may be mounted thereon after the ceramic substrate 22 is fixed to the circuit board 12.

In this process, the ceramic substrate 22 is surface-mounted by a reflow process in which solder paste is applied on the upper surface of the island 18, and the ceramic substrate 22 is placed on the upper surface of the solder paste and then is subjected to heat curing. Here, both of the metal film 20 formed on the lower surface of the ceramic substrate 22 and the island 18 formed on the upper surface of the circuit board 12 are made of metals and have the excellent wettability of solder. Accordingly, the fixing material 38 made of the fused solder is entirely brought into contact with the both thereof, thereby obtaining a good junction.

Figure 8A:
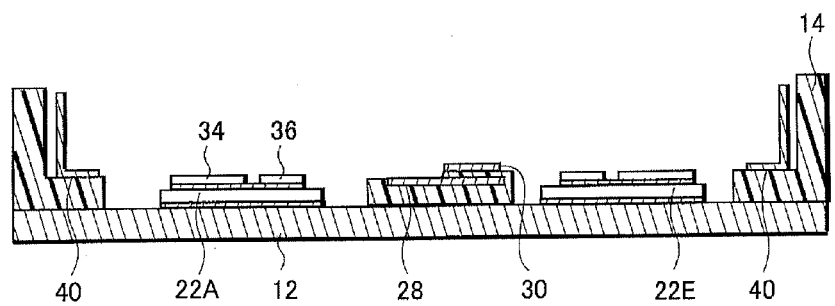
FIG. 8A to FIG. 8C are cross-sectional views.

Next, with reference to FIG. 8A, the case material 14 is bonded to the upper surface periphery part of the circuit board 12. In the case material 14, as mentioned above, the output leads 28 and 30 and the wiring leads 40 are incorporated in advance. The case material 14 is bonded to the upper surface of the circuit board 12 with a bonding material such as an epoxy resin.

Figure 8B:
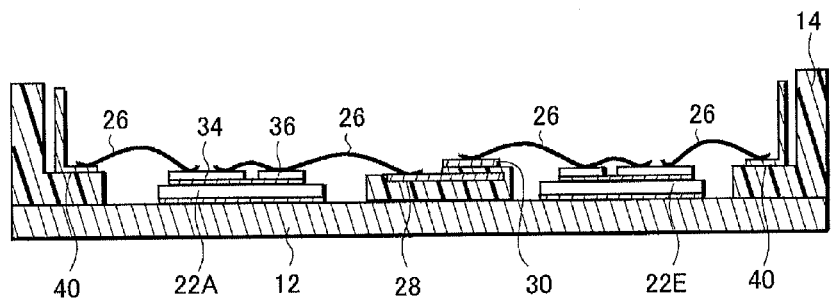

Next, with reference to FIG. 8B, the circuit elements and the leads are electrically connected to each other by the fine metal wires 26. Specifically, the gate electrode of the transistor 34 fixed to the upper surface of the ceramic substrate 22B is connected to the wiring lead 40 through the fine metal wire 26. Moreover, the emitter electrode disposed on the upper surface of the transistor 34, together with the anode electrode provided on the upper surface of the diode 36, are connected to the output lead 30. Moreover, the transistor 34 mounted on the upper surface of the ceramic substrate 22F is connected to the output lead 28 through the fine metal wires 26.

In this process, the fine metal wires made of aluminum having a diameter of about 150 μm to 500 μm are used for connection of the circuit elements. Moreover, instead of the wire bonding by the fine metal wires, ribbon bonding in which a ribbon-shaped aluminum foil is used may be employed.

Figure 8C:
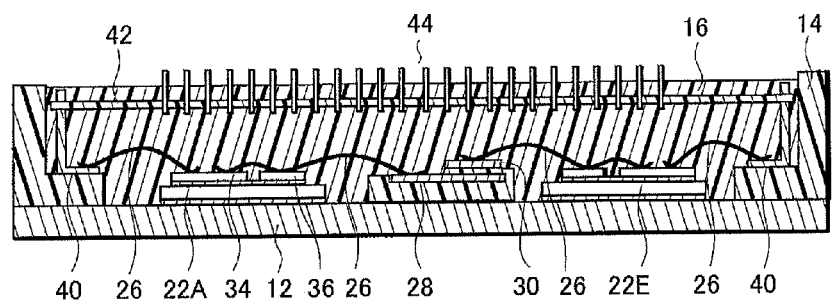
Figure 9:
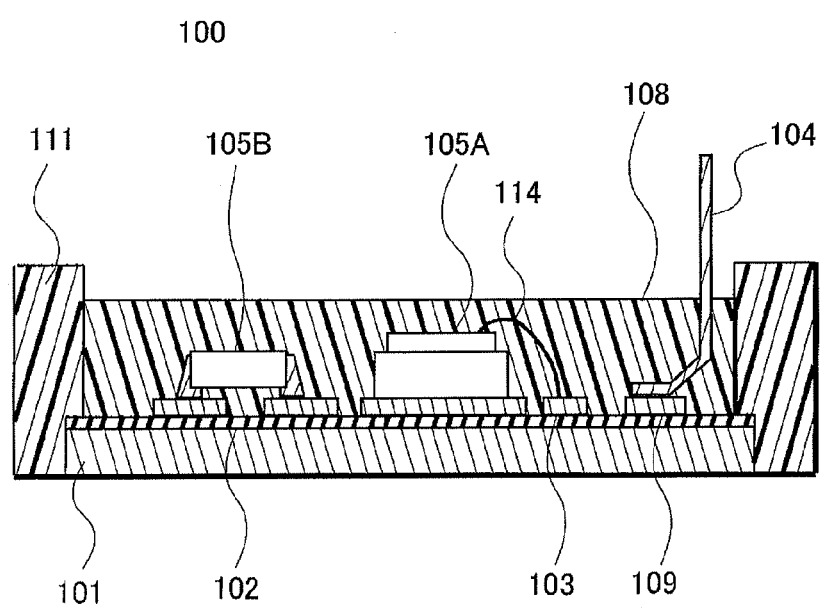
FIG. 9 is a cross-sectional view illustrating a circuit device in the background art.

Next, with reference to FIG. 8C, upper end portions of the wiring leads 40 are inserted into holes of the substrate 42. Accordingly, the wiring leads 40 are connected to the signal leads 44 provided to the substrate 42 through the conductive pattern formed on the surface of the substrate 42.

In addition, the sealing resin 16 is filled into a space surrounded by the case material 14. As for the sealing resin 16, a silicon resin or an epoxy resin is employed. Moreover, a resin material into which a filler such as alumina is filled may be employed as the sealing resin 16. The transistor 34, the diode 36, the fine metal wires 26, the wiring leads 40, the substrate 42, and the like are resin-sealed by the sealing resin 16.

The hybrid integrated circuit device 10 illustrated in FIG. 1 is manufactured through the processes above.

The invention claimed is:

1. A circuit device, comprising:
  a circuit board having a perimeter and a central portion that is interior to the perimeter and does not extend through the perimeter;
  a semiconductor element disposed on an upper surface of the circuit board;
  a first lead electrically connected to the semiconductor element, on the upper surface of the circuit board wherein the first lead traverses the central portion of the circuit board;
  a second lead electrically connected to the semiconductor element, at least a part of the second lead being superimposed on the first lead;
  a case material forming a frame-shape assembled onto the upper surface of the circuit board, the frame-shape forming a space overlying the semiconductor element wherein a portion of the frame-shape of the case material traverses the central portion underlying the first lead and is positioned between the first lead and the circuit board and between the first lead and the second lead and wherein the semiconductor element is not connected to another lead having a portion that is both on the circuit board and not on the frame-shape of the case material; and
  a sealing resin disposed within the space.

2. The circuit device according to claim 1, wherein the semiconductor element includes a first transistor and a second transistor connected to each other, and the first transistor and the second transistor are disposed in positions opposed to each other across the first lead and the second lead.

3. The circuit device according to claim 2, wherein the first transistor and the second transistor are connected to each other through a fine metal wire formed above the first lead and second lead.

4. The circuit device according to claim 1, wherein the first lead and the second lead are in a state being incorporated in the portion of the case material.

5. The circuit device according to claim 4, wherein the first lead and the second lead are insulated from the circuit board by the portion of the frame-shape of the case material.

6. The circuit device according to claim 1, wherein the circuit board is a substrate made of a metal, and the semiconductor element is mounted on an upper surface of a ceramic substrate fixed to the upper surface of the circuit board.

7. The circuit device according to claim 6, wherein the ceramic substrate is fixed to an island formed on the upper surface of the circuit board with solder.

8. The circuit device according to claim 1, wherein the semiconductor element constitutes an inverter circuit, and direct-current power yet to be converted into alternating-current power by the inverter circuit is supplied through the first lead and the second lead.

9. The circuit device according to claim 1, wherein the semiconductor element includes a converter circuit configured to boost a direct-current power inputted from the outside, and the inverter circuit configured to convert the boosted direct current power into an alternating-current power, and one of the first lead or the second lead to input the direct-current power to the inside and the other one of the first lead or the second lead to output the alternating current power to the outside are incorporated in the case material.

10. The circuit device according to claim 1 wherein the first lead and the second lead are incorporated into the frame-shape of the case material prior to attaching the case material to the circuit board.

11. A hybrid circuit device comprising:
  a circuit board;
  one or more semiconductor elements disposed on an upper surface of the circuit board;
  a case material forming a frame-shape surrounding a perimeter of the circuit board and forming a space overlying at least a portion of the circuit board, a first portion of the frame-shape of the case material extending laterally across a portion of a central area of the circuit board wherein the central area is spaced away from the perimeter and extends toward two internal sides of the case material; and
  a first lead incorporated with the first portion of the frame-shape of the case material and traversing the portion of the central area, the first lead electrically connected to a first semiconductor element of the one or more semiconductor elements wherein the semiconductor element is not connected to another lead having a portion that is both on the circuit board and external to the frame-shape of the case material; and a second lead superimposed on the first lead with the first portion of the frame-shape of the case material disposed between the first lead and the second lead.

12. The hybrid circuit of claim 11 further including the second lead electrically connected to either the first semiconductor element or another semiconductor element of the one or more semiconductor elements.

13. The hybrid circuit of claim 12 wherein the second lead is incorporated into the first portion of the case material and traverses the portion of the central area.

14. The hybrid circuit of claim 11 further including a third lead disposed in a second portion of the case material that is surrounding the outer perimeter.

15. The circuit device according to claim 1 wherein the case material has upper and lower sides on an interior of the case material; and further including
a third lead coupled to semiconductor element and disposed on the upper and lower sides of the case material.

16. The circuit device of claim 1 wherein the sealing resin one of overlies or covers the semiconductor element and the portion of the frame-shape of the case material.

17. The hybrid circuit device of claim 11 further including a sealing resin disposed within the space and overlying the one or more semiconductor elements.

18. The circuit device of claim 17 wherein the sealing resin one of covers the semiconductor element and the first portion of the frame-shape of the case material.

* * * * *